(12) United States Patent
Hakamata

(10) Patent No.: US 6,930,303 B2
(45) Date of Patent: Aug. 16, 2005

(54) LINEAR LIGHT SOURCE AND READING LIGHT EXPOSURE APPARATUS

(75) Inventor: Kazuo Hakamata, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 317 days.

(21) Appl. No.: 10/394,010

(22) Filed: Mar. 24, 2003

(65) Prior Publication Data

US 2003/0183751 A1 Oct. 2, 2003

(30) Foreign Application Priority Data

Mar. 29, 2002 (JP) .................................... 2002-096971
Aug. 29, 2002 (JP) .................................... 2002-250142

(51) Int. Cl.[7] .............................................. H01J 5/02
(52) U.S. Cl. .................................... 250/239; 250/216
(58) Field of Search ................................ 250/239, 216, 250/214.1, 208.1; 600/248, 249; 362/248; 606/11; 607/90, 88, 34, 36

(56) References Cited

U.S. PATENT DOCUMENTS

| | | | |
|---|---|---|---|
| 4,176,275 A | 11/1979 | Korn et al. | |
| 5,440,146 A | 8/1995 | Steffen et al. | |
| 5,510,626 A | 4/1996 | Nelson et al. | |
| 6,268,614 B1 | 7/2001 | Imai | |
| 6,353,217 B1 * | 3/2002 | Uchio et al. | ............ 250/214 R |
| 2001/0025936 A1 | 10/2001 | Shoji | |

OTHER PUBLICATIONS

"A Method of Electronic Readout of Electrophotographic and Electroradiographic Image" on P 178 to 182 in the Journal of Applied Photographic Engineering, vol. 4, No. 4, Fall 1978.

* cited by examiner

Primary Examiner—Que T. Le
(74) Attorney, Agent, or Firm—Sughrue Mion, PLLC

(57) ABSTRACT

A linear light source has LED chips disposed in an array that provides a higher-intensity light beam with a narrower half-beam width at the converging point. Each of the LED chips is disposed in such a way that its emission regions along a diagonal line are aligned with those of adjacent chips in a straight line. The slit is disposed in such a way that its opening is placed opposite to the emission regions aligned in a straight line. The utilization area is defined by the opening of the slit. The utilization area can include a larger emission region than that of the conventional linear light source so that a higher-intensity light beam with a narrower half-beam width can be obtained at the converging point.

21 Claims, 8 Drawing Sheets

SCANNING DIRECTION

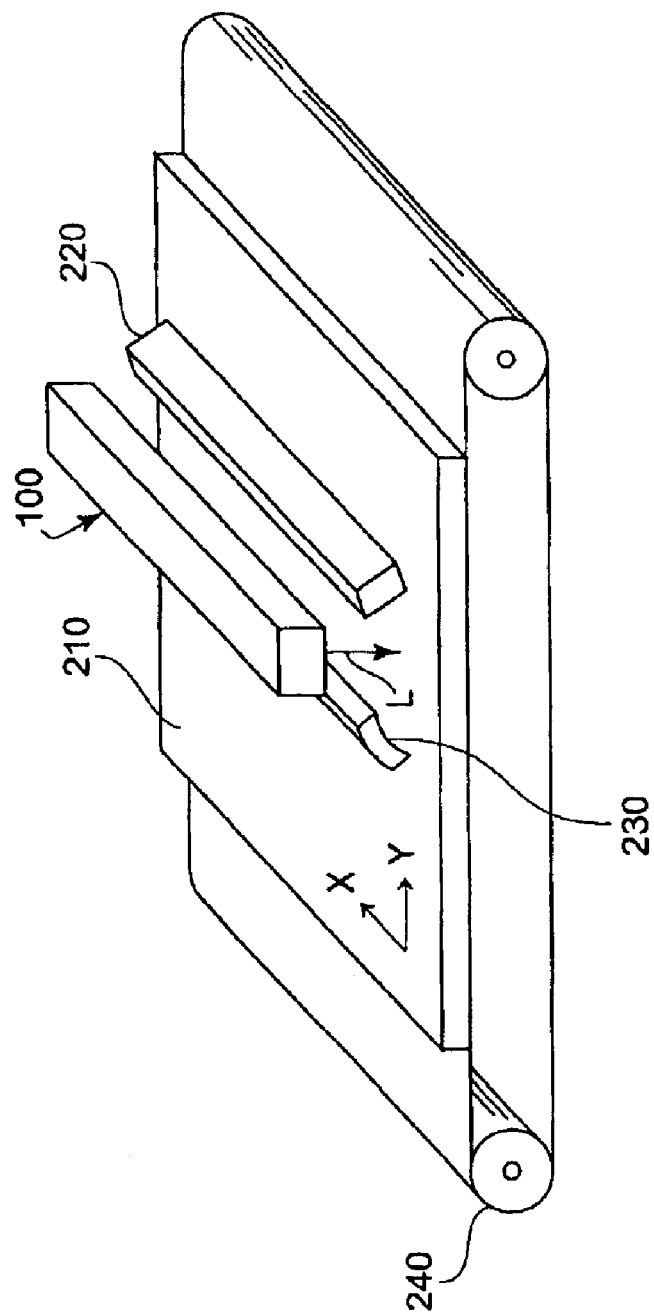

LINEAR LIGHT SOURCE AND READING LIGHT EXPOSURE APPARATUS

BACKGROUND OF THE INVENTION

1. Field of the Invention

The present invention relates to a linear light source. More specifically, it is directed to a linear light source comprising a plurality of luminous elements disposed in a straight line, and an apparatus capable of radiating reading light onto image recording media to read out images recorded thereon using said light source.

2. Description of the Related Art

In medical X-ray photography, an image reading system for reading out an electrophotografic latent image or electroradiographic image information has been proposed, in which a photoconductor made of an X-ray sensitive material, such as an a-Se selenium plate, is used as an electrophotografic recording medium to reduce an amount of dosage exposed to a subject and to improve diagnostic accuracy, and a radial ray, such as an X-ray which carries electroradiographic image information is radiated onto the medium to store charges of a latent image carrying the electroradiographic image information, which is subsequently read out by scanning the medium with a laser beam and detecting the current produced in the medium through flat plate or striped electrodes. (Refer to, for example, U.S. Pat. Nos. 4,176,275, 5,440,146 and 5,510,626 or a document entitled "A Method of Electronic Readout of Electrophotographic and Electroradiographic Image" on P 178 to 182 in the Journal of Applied Photographic Engineering, Volume 4, Number 4, Fall 1978.)

In the system described in the U.S. Pat. Nos. 4,176,275 and 5,510,626 or the aforementioned document, a linear narrow light beam formed by extending a light beam emitted from an argon laser is brought into focus on an electrophotografic medium with cylindrical lenses on the apparatus and is mechanically deflected to scan the medium, and the electrophotografic latent image recorded thereon is read out in parallel by wire electrodes disposed in stripes.

Also, the applicant has proposed a multi-layered electrophotografic recording medium which is layered in the order of a first electric conductor layer having permeability for radial rays, a recording photoconductive layer which takes on photoconductivity when exposed to a recording radial ray, a charge transport layer which behaves substantially as an insulator against charges having the same polarity with the charges charged on the first electric conductor layer and as an electric conductor for charges having the reverse polarity, a reading photoconductive layer which takes on photoconductivity when exposed to reading light, and a second electric conductor layer having permeability for the reading light; and an reading apparatus for reading out electroradiographic images recorded on the multi-layered electrophotografic recording medium. (Refer to, for example, U.S. Pat. No. 6,268,614.)

The reading apparatus described in U.S. Pat. No. 6,268,614 is an apparatus for reading out an electrophotografic latent image recorded on an electrophotografic recording medium by scanning the medium with the reading light radiated from a light source. For the reading light exposure apparatus which provides the light source for the reading light, a spot light beam exposure means, in which the medium is main/sub-scanned by a spot light beam, such as a laser beam, and a linear light beam exposure means, in which the medium is sub-scanned by a linear light beam are described. For the linear light source, a light source comprising a plurality of light emitting spots disposed in a line is described as an example.

A linear light source comprising a plurality of LEDs disposed in an array is disclosed as one of the aforementioned linear light sources. (Refer to, for example, U.S. Laid-Open No. 20010025936.) LEDs are well suited for the light source used in the reading light exposure apparatus, because they have higher output efficiency for the input energy and are more economical than LDs or other similar devices.

When a linear light source comprising an array of LEDs is used for the reading light exposure apparatus, the image information recorded on a medium is read out by converging light beams emitted from the LEDs on the medium in a straight line through cylindrical lenses disposed in parallel to the arranging direction of the LEDs and scanning the medium with the converged light beam. Typically, the reading performance of the reading light exposure apparatus is dependent on the profiles of the linearly converged light beam, particularly on the intensity and half-beam width of the light beam. It is preferable that the intensity be as high as possible and the half-beam width as narrow as possible.

FIG. 10 shows a typical conventional linear light source 1 comprising a plurality of surface emitting LED chips 10 disposed in a straight line. Each of the LED chips 10 has bonding pad sections 12 for direct bonding of wires to the electrodes of the chip and emission regions 13 which emit light when a current flows between the electrodes, and the bonding pad sections 12 are connected to a power supply (not shown) through an Au wire 11. Also, a utilization area 19 is defined by a slit (not shown) in order to narrow down the half-beam width of the reading light at the converging point. That is, the light beams radiated through the utilization area 19 are converged and used as the reading light.

The aforementioned linear light source 1, however, has a disadvantage that most of the utilization area 19 is occupied by non-emission regions, including the bonding pad sections 12, so that it is difficult to obtain reading light having sufficient intensity. Larger utilization area provides a stronger reading light, but at the same time, the half-beam width of the light at the converging point also becomes broader.

An LED chip having a non-emission region in the center is sometimes used for constructing a linear light source, but it also has similar disadvantage described above.

SUMMARY OF THE INVENTION

As such, it is the object of the invention to provide a linear light source capable of providing a high-intensity beam with a narrow half-beam width at the converging point, and a reading light exposure apparatus which uses said linear light source.

A linear light source according to the invention comprises a plurality of luminous elements disposed in a straight line and an optical means having an opening which defines a utilization area of the luminous elements, each of the luminous elements is a squarish surface emitting element having non-emission regions along a first diagonal line, and disposed in such a way that a second diagonal line which is different from the first diagonal line is aligned with that of adjacent elements in a straight line, and the opening of the optical means is placed opposite to the second diagonal lines aligned in a straight line.

Another linear light source according to the invention comprises a plurality of luminous elements disposed in a straight line and an optical means having an opening which defines a utilization area of the luminous elements, each of the luminous elements is a surface emitting element having a non-emission region in the approximate center of the element and a wire is connected thereto, and disposed in such a way that the non-emission region is aligned with that of adjacent elements in a straight line, and the wires are extended in the same direction substantially perpendicular to the arranging direction of the luminous elements, and the opening of the optical means is placed opposite to the emission regions located on opposite side of the wires. "The same direction substantially perpendicular to the arranging direction of the luminous elements" may be either direction substantially perpendicular to the arranging direction of the luminous elements.

Still another linear light source according to the invention comprises a plurality of luminous elements disposed in a straight line and an optical means having an opening which defines a utilization area of the luminous elements, each of the luminous elements is a surface emitting element having a non-emission region in the approximate center, and disposed alternately in the direction perpendicular to the arranging direction of the elements so that a portion of each emission region is aligned with that of adjacent elements in a straight line, and the opening of the optical means is placed opposite to the aligned emission regions.

"An optical means having an opening which defines a utilization area of the luminous elements" includes any optical means having a function corresponding to the opening which defines a utilization area of the luminous elements as well as a slit having a mechanical opening. The optical means includes, for example, a density distribution filter constructed to have an optical opening, a SELFOC lens, etc. It may be a combination of a plurality of optical components as required. For example, it may be a combination of a plurality of slits, a combination of a slit and a SELFOC lens, or other combinations.

For each linear light source described above, the luminous elements may be LEDs, and the opening may be placed in the immediate vicinity of the luminous elements.

The reading light exposure apparatus according to the invention is an apparatus capable of radiating reading light onto an image recording medium in reading out a prerecorded image by scanning the medium with the reading light, wherein it uses aforementioned linear light sources.

The image recording medium may be either an electophotographic recording medium, in which image information is recorded on the medium as an electrophotographic latent image and an electric current is produced in accordance with the latent image when the medium is scanned by the reading light, or a storage phosphor, in which image information is stored on the medium and photostimulated light is emitted in accordance with the image information when the medium is scanned by reading light.

The "reading light" may be any electromagnetic wave of any frequency capable of reading out image information as well as what is called light, including infrared, visible and ultraviolet light. That is, if the image recording medium is the electrophotographic recording medium, the reading light may be any electromagnetic wave of any frequency capable of reading out an "electrophotographic latent image", and if it is the storage phosphor, the reading light may be any electromagnetic wave of any frequency which can serve as the exciting light for the medium to emit photostimulated light. This will also apply to the description hereinafter.

The linear light source according to the invention comprises a plurality of squarish surface emitting luminous elements, each having non-emission regions along a first diagonal line and is disposed in such a way that a second diagonal line which is different from the first diagonal line is aligned with that of adjacent elements in a straight line; and a optical means having an opening placed opposite to the aligned second diagonal lines, so that the light emitting regions aligned in a straight line along the second diagonal lines are available for the utilization area, thus the light emitting region within the utilization area is increased and a high-intensity light beam with a narrow half-beam width at the converging point can be obtained.

Also, it can be constructed with a fewer number of luminous elements, which requires less capacity for the power supply, thus the noise from the power supply is reduced, as well as the construction cost. Further, although an increase in the current to a luminous element generally results in an increase in the temperature of the element, often causing a reduced operating life of the element, the linear light source of the invention has efficient heat dissipation, so that the amount of electric current supplied to the source can be increased, thereby the intensity of the beam can be increased even higher.

Another linear light source according to the invention comprises a plurality of surface emitting elements, each having a non-emission region in the approximate center and a wire extending in the same direction as that of other elements substantially perpendicular to the arranging direction of the luminous elements is connected thereto, and is disposed in such a way that the non-emission region is aligned with that of adjacent elements in a straight line; and an optical means having an opening which defines a utilization area of the luminous elements placed opposite to the emission regions located on opposite side of the wires so that the light emitting region of each element located on opposite side of the wire is available for the utilization area, thus the light emitting area within the utilization area is increased and a high-intensity light beam with a narrow half-beam width at the converging point can be obtained.

Also, scattered light beams are prevented from entering into the opening so that the flare can be reduced.

Still another linear light source according to the invention comprises a plurality of surface emitting elements, each having a non-emission region in the approximate center and is placed alternately in the direction perpendicular to the arranging direction of the elements in such a way that a portion of the emission region is aligned with that of adjacent elements in a straight line; and an optical means having an opening which defines a utilization area of the luminous elements placed opposite to the aligned emission regions so that the emission regions aligned in a straight line are available for the utilization area, thus the light emission region within the utilization area is increased and a high-intensity light beam with a narrow half-beam width at the converging point can be obtained. Also, this configuration provides better heat dissipation so that the amount of electric current supplied to the elements can be increased, thereby the intensity of the beam can be increased even higher.

Further, the luminous elements can be readily connected in series. Generally, the intensity of the light from a luminous element is substantially proportional to the amount of current flowing between the electrodes. Serial connection of the elements, in which a same amount of current flows through all the elements, can reduce the effects caused by the variation in forward voltage Vf of the respective elements, thereby the intensity thereof can be equalized.

The reading light exposure apparatus according to the invention uses aforementioned linear light source and scans the medium with high-intensity reading light with a narrow half-beam width formed by converging light beams radiated from the source into a narrow line on the medium so that it can provide improved reading performance in reading out image information from the image recording medium.

BRIEF DESCRIPTION OF THE DRAWINGS

FIG. 8 is a drawing illustrating an image reading system for reading out images from a storage phosphor sheet based on a reading light exposure apparatus of the invention.

DESCRIPTION OF THE PREFERRED EMBODIMENTS

Figure 1:
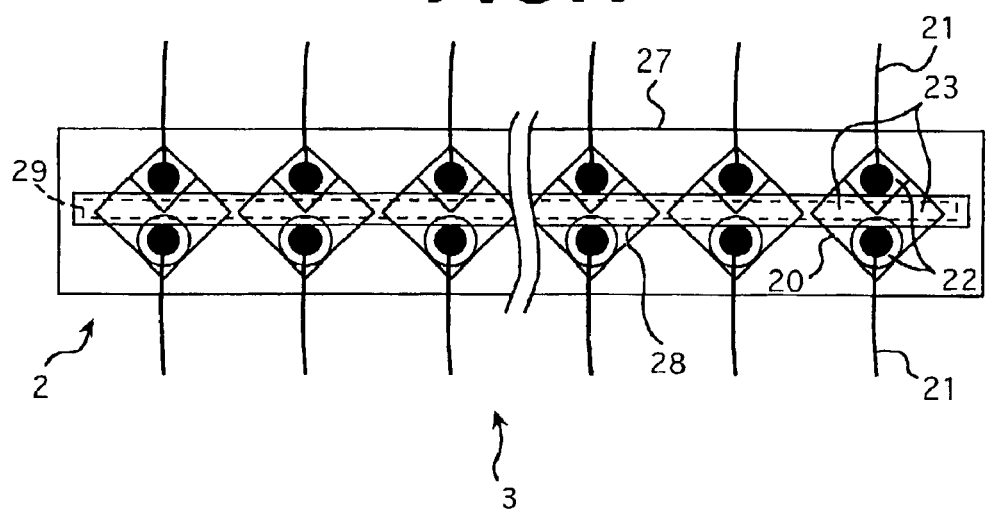
FIG. 1 is a schematic configuration diagram of a linear light source according to a first embodiment of the invention.

First, preferred embodiments of a linear light source according to the invention will be described hereinafter. FIG. 1 is a schematic configuration diagram of a linear light source 3 according to a first embodiment of the invention. In FIG. 1, the linear light source 3 comprises a light source 2 having a plurality of LED chips 20 disposed in a straight line and a slit 27 having an opening 28 extending in the longitudinal direction of the light source 2.

The LED chip 20 has bonding pad sections 22 for direct bonding of wires to the electrodes of the chip and emission regions 23 which emit light when a current flows between the electrodes, and the boding pad sections 22 are connected to a power supply (not shown) through an Au wire 21. The slit 27 is finished in matte-black and is insulated.

Figure 10:
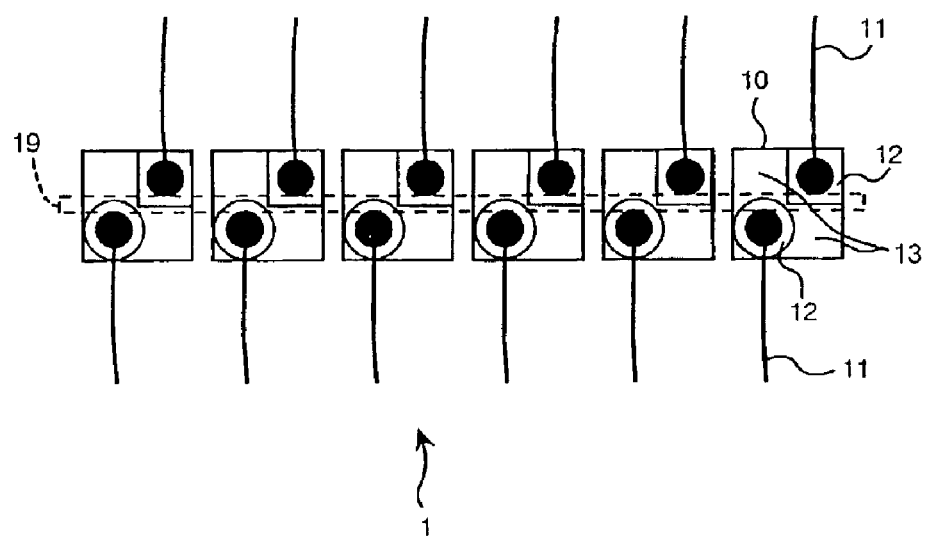
FIG. 10 is a schematic configuration diagram of a conventional linear light source.

Each of the LED chips 20 is disposed in such a way that its emission regions 23 along a diagonal line are aligned with those of adjacent LED chips in a straight line. The slit 27 is disposed in such a way that the opening 28 of the slit 27 is placed opposite to the emission regions 23 aligned in a straight line. A utilization area 29 is defined by the opening 28 of the slit 27. The utilization area 29 includes a larger emission region compared with the utilization area 19 of the conventional linear light source 1 shown in FIG. 10, thus a higher-intensity light beam with a narrower half-beam width can be obtained at the converging point.

The arrangement of the LED chips in this manner reduces mounting density of the chips and improves efficiency of the heat dissipation, allowing the LED chips to have a longer operating life. Also, the linear light source 3 can be constructed with a fewer number of luminous elements, thus requiring less cost for the construction. Further, a power source for the light source 2 requires less capacity and, therefore, produces less noise. Since the light source has efficient heat dissipation, the amount of electric current supplied to the LED chips 20 can be increased, thereby the intensity of the linear light beam from the source can be increased even higher.

In cases where a linear light beam with conventional intensity is sufficient, the number of LED chips or a total amount of electric current supplied to the chips can be reduced.

Further, "kicking" or scattering of luminous flux due to the Au wires 21 can be minimized by arranging the wires as far apart as possible from the utilization area 29 and as close as possible to the substrate of the LED chips.

In order to utilize the light beams emitted from the LED chips 20 effectively, the surface of the substrate may be a mirrored surface to reflect the light beams emitted thereto.

Instead of using the slit 27, for example, a density distribution filter or SELFOC lens may be used. It may be a combination of a plurality of optical components as needed. When a distribution angle of the LED chips 20 is wide, a thick slit, a combination of two slits, a combination of a slit and a SELFOC lens, or other combinations may be used. Also, a pinhole array or the like can be used instead of the slit.

Figure 2:
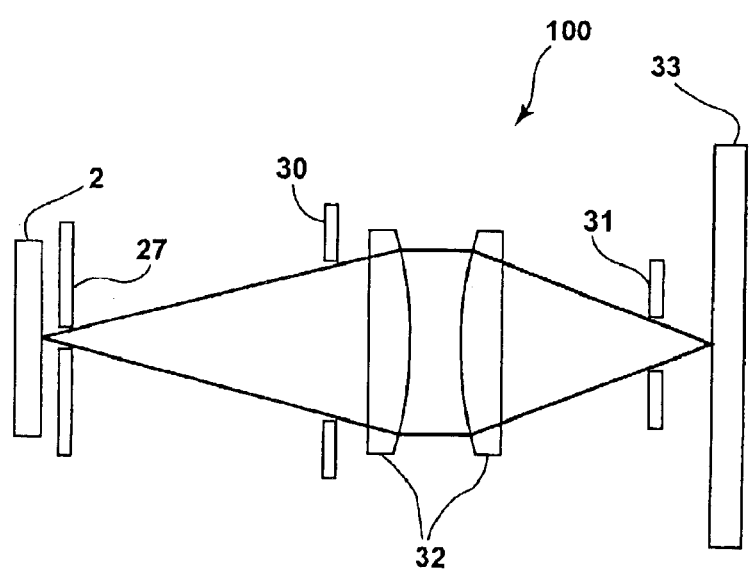
FIG. 2 is a schematic configuration diagram of a reading light exposure apparatus using the linear light source illustrated in FIG. 1.

FIG. 2 is a schematic configuration diagram of a reading light exposure apparatus 100 for reading out image information recorded on an image recording medium 33. FIG. 2 shows the reading light exposure apparatus 100 viewed from the arranging direction of LED chips 20 of a light source 2. The exposure apparatus 100 comprises a linear light source 3 (light source 2 and slit 27), a slit 30, two cylindrical lenses 32 and a slit 31, and scans the medium from top down in the FIG. 2 by a scanning means (not shown). The light beams radiated from the light source 2 are narrowed down by the slit 27 with unwanted light beams being further blocked by the slit 30, which are converged by the cylindrical lenses 3 with unwanted light beams being blocked still further by the slit 31 and radiated onto the image recording medium 33 as a linear light beam.

The exposure apparatus 100 provides improved reading performance for reading out image information recorded on the medium 33, since it uses the linear light source 3 and a high-intensity linear light beam with a narrow half-beam width is radiated onto the medium 33.

If the width of the opening 28 of the slit 27 is expanded as wide as that of the LED chip 20 to collect more light beams from the LED chips 20, higher-intensity reading light can be obtained.

Figure 3:
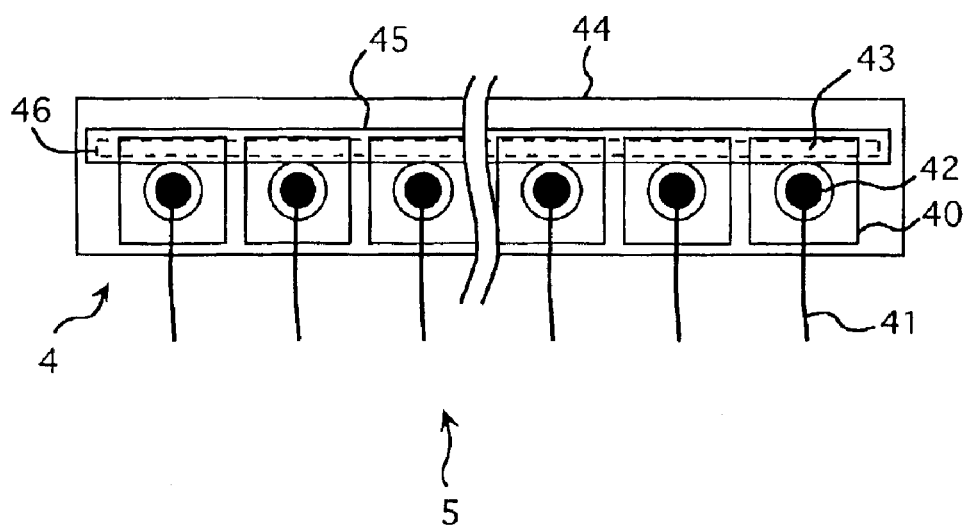
FIG. 3 is a schematic configuration diagram of a linear light source according to a second embodiment of the invention.

FIG. 3 is a schematic configuration diagram of a linear light source 5 according to a second embodiment of the invention. The linear light source 5 comprises a light source 4 and a slit 44 having an opening 45 extending in the longitudinal direction of the light source 4. The light source 4 comprises a plurality of LED chips 40, each having a bonding pad section 42, which is a non-emission region, in the center and emission region 43 in the periphery, disposed adjacently in such a way that the bonding pad sections 42 are aligned in a straight line. All Au wires 41 connected to the bonding pad sections 42 of the respective LED chips 40 are extended in the same direction substantially perpendicular to the arranging direction of the LED chips 40. The slit 44 is disposed in such a way that the opening 45 of the slit 44 is placed opposite to the emission regions 43 located on the opposite side of the wires.

A utilization area 46 is defined by the opening 45 of the slit 44. The utilization area 46 includes a larger emission region than that of a conventional linear light source, in which the utilization area is defined over the bonding pad sections 42, so that a higher-intensity light beam with a narrower half-beam width can be obtained at the converging point. Also, scattered light beams due to the Au wires 41 are prevented from entering into the opening 45 so that the flare can be reduced.

Figure 4:
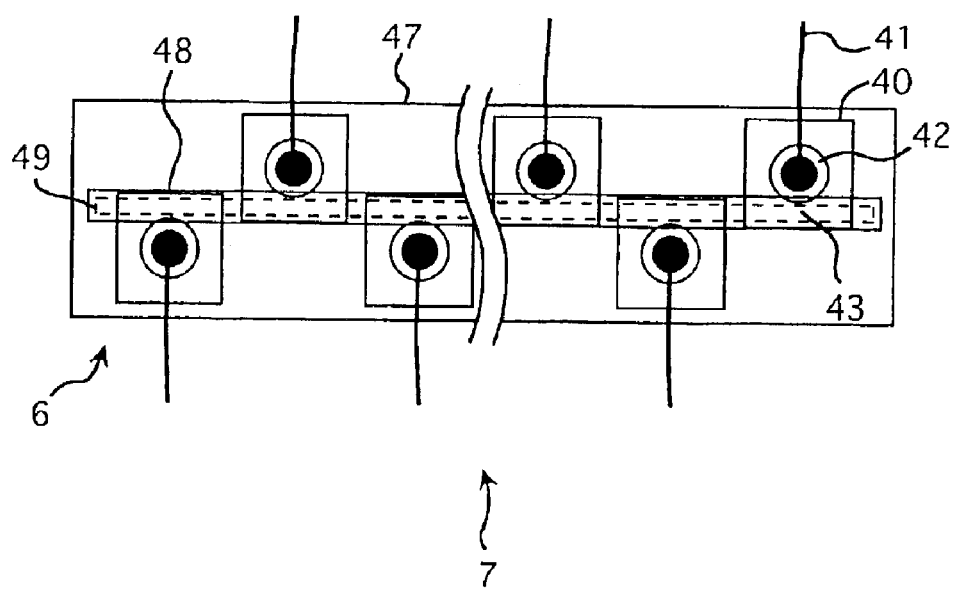
FIG. 4 is a schematic configuration diagram of a linear light source according to a third embodiment of the invention.

FIG. 4 is a schematic configuration diagram of a linear light source 7 according to a third embodiment of the invention. The linear light source 7 comprises a light source 6 and a slit 47 having an opening 48 extending in the longitudinal direction of the light source 6. The light source 6 comprises LED chips 40 of the same type as used in the second embodiment, disposed alternately in the direction perpendicular to the arranging direction of the chips so that a portion of each emission region 43 is aligned with that of adjacent chips in a straight line. The slit 47 is disposed in such a way that the opening 48 of the slit 47 is placed opposite to the emission regions 43 aligned in a straight line. An Au wire 41 connected to the bonding pad section 42 of each LED chip is extended in a direction perpendicular to the arranging direction of the LED chips 40 and opposite to an utilization area 49.

The utilization area 49 is defined by the opening 48 of the slit 47. The utilization area 49 includes a larger emission region so that a high-intensity light beam with a narrower half-beam width can be obtained at the converging point. Also, scattered light beams due to the Au wires 41 are prevented from entering into the opening 48 so that the flare can be reduced.

Also, the arrangement of the LED chips in the alternate way can improve the efficiency of heat dissipation, allowing the LED chips to have a longer operating life. Further, since the light source has efficient heat dissipation, the amount of electric current supplied to the LED chips 40 can be increased, thereby the intensity of the linear light beam from the source can be increased even higher.

Further, the LED chips 40 can be readily connected in series. Generally, the intensity of light from an LED chip is substantially proportional to the amount of current flowing between the electrodes. Serial connection of the LEDs, in which a same amount of current flows through all the LEDs, can reduce the effects caused by the variation in forward voltage Vf of the respective LEDs. Therefore, serial connection is a useful means to equalize the intensity of the respective LED chips.

Figure 5:
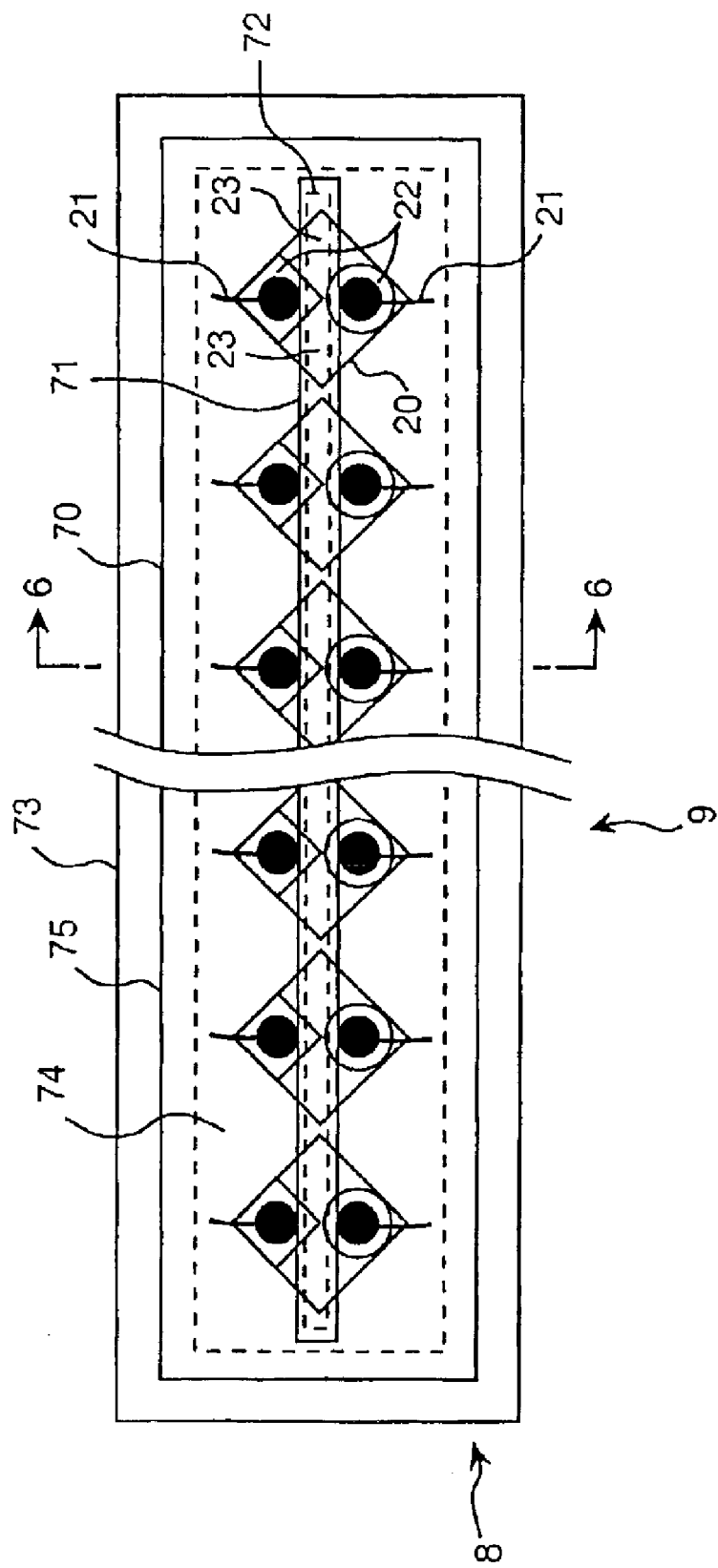
FIG. 5 is a schematic configuration diagram of a linear light source according to a fourth embodiment of the invention.
Figure 6:
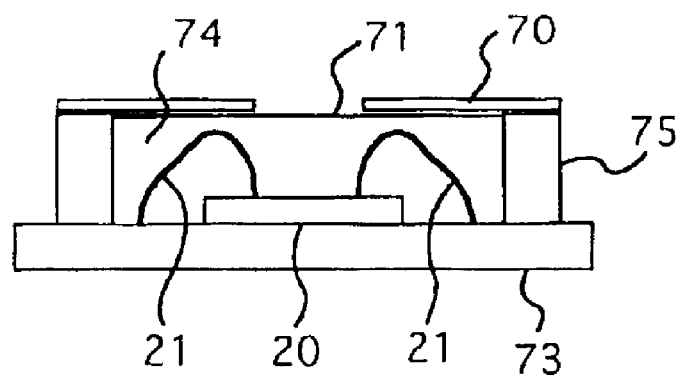
FIG. 6 is a side cross-sectional view of a linear light source.

Next, a linear light source 9 according to a fourth embodiment of the invention is described hereinafter with reference to FIGS. 5 and 6. FIG. 5 is a schematic configuration diagram of the linear light source 9 and FIG. 6 is a cross-sectional view of the linear light source 9 shown in FIG. 5 taken along the line 6—6. For a component identical to that of the first embodiment shown in FIG. 1 is given the same reference number and will not be elaborated upon further here unless otherwise required.

The linear light source comprises a light source 8 and a slit 70 having an opening 71 extending in the longitudinal direction of the light source 8 and is placed in the immediate vicinity of the light source 8. The light source 8 comprises an elongated rectangular substrate 73 made of insulated aluminum and a plurality of LED chips 20 mounted thereon, in which the LED chips 20 are disposed in such a way that light emission regions 23 located along the diagonal line of each chip is aligned with that of adjacent chips in a straight line, as in the light source 2 of the first embodiment. The arrayed LED chips 20 on the substrate 73 are sealed with a resin 74 which is transparent for emitted light, and an antisagging frame 75 made of aluminum finished in matte-black is placed in the circumferential area of the resin 74. The slit 70 is placed in the immediate vicinity of the resin 74 and the antisagging frame 75. The slit 70 is disposed in such a way that the opening 71 of the slit 70 is placed opposite to the emission regions 23 aligned in a straight line. A utilization area 72 is defined by the opening 71 of the slit 70.

The front of a bonding pad sections 22 and an Au wire 21 is masked by the slit 70. In this embodiment, the thickness of the LED chip 20 is 70 $\mu$m, the thickness of the slit 70 is 50 $\mu$m, the height of the antisagging frame 75 is 200 $\mu$m, and the distance between the front surface of the LED chips 20 and the rear surface of the antisagging frame 75 is 130 $\mu$m. Preferably, the distance between the front surface of the LED chips 20 and the rear surface of the antisagging frame 75 is less than 150 $\mu$m when the thickness of the LED chip is 70 $\mu$m and the thickness of the slit 70 is 50 $\mu$m.

This embodiment provides similar advantages to those provided in the first embodiment. In addition, by placing the slit 70 in the immediate vicinity of the LED chips 20, the scattered beams due to the bonding pad sections 22 and the Au wires 21 are further prevented from passing through the opening 71 of the slit 70 and the flare is further reduced. The antisagging frame 75 is made of insulated aluminum, so that it can prevent the wiring on the substrate, including the Au wires 21, from shunted. Further, the slit 70 is finished in matte-black and insulated, so that scattered beams due to the slit 70 and shunt of the wires are prevented from occurring.

Further, the substrate 73 and the antisagging frame 75 are made of an identical material, so that they have the same coefficient of thermal expansion, and the antisagging frame 75 will not be deformed even if temperature variation is developed during the construction of the linear light source 9.

In the second, third and fourth embodiments, as in the first embodiment, for example, a density distribution filter having an optical opening, a SELFOC lens, or others may be used instead of the slit. It may be a combination of a plurality of optical components or a pinhole array as needed. Further, these embodiments can be applied to the reading light exposure apparatus 100 shown in FIG. 2.

Figure 7A:
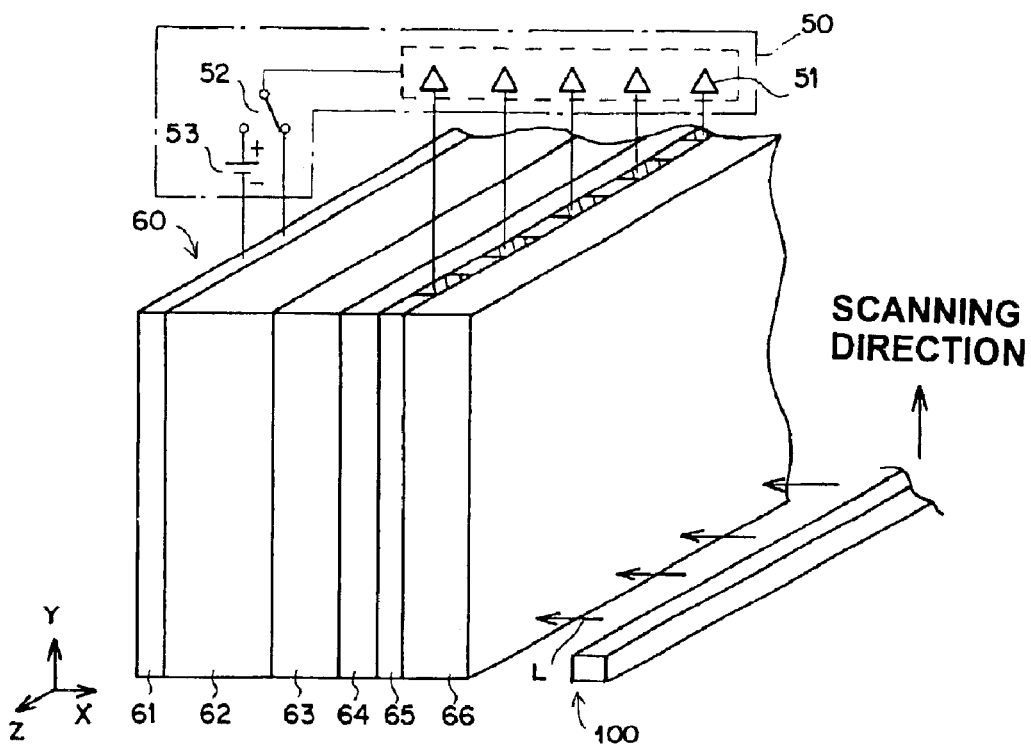
FIG. 7A is a perspective view of an image detection/reading system having an electrophotographic recording medium based on a reading light exposure apparatus of the invention.
Figure 7B:
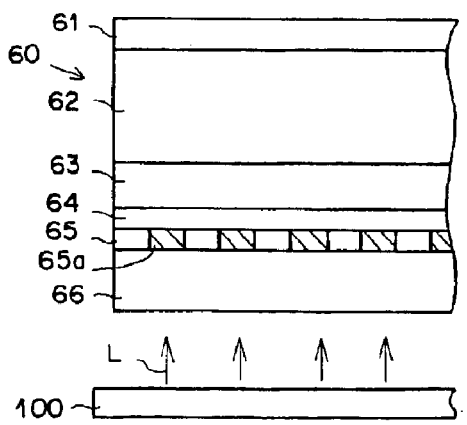
FIG. 7B is an X-Z cross-sectional view of the image detection/reading system illustrated in FIG. 7A.

Next, FIG. 7 is a schematic configuration diagram of an electroradiographic detection/reading system based on the reading light exposure apparatus 100 according to a fifth embodiment of the invention. FIG. 7A is a perspective view and FIG. 7B is an X-Z cross-sectional view thereof. As shown in FIG. 7, the system comprises an electrophotographic recording medium 60 formed on a glass substrate 66; an exposure apparatus for radiating reading light onto the electrophotographic recording medium 60 when reading out image information from the medium 60; and an electric current detection means 50 for detecting a current flowing out from the medium 60 produced by the scanning of the medium 60 with the reading light.

The electrophotographic medium, which is an electroradiographic medium, records electroradiographic information as an electrophotographic latent image and produces an electric current in accordance with the electrophotographic latent image. More specifically, it is a multi-layered medium comprising a first electric conductor layer 61 having permeability for radial rays (e.g., an X-ray, hereinafter referred to as the "recording light"; a recording photoconductive layer 62 which takes on photoconductivity when irradiated by the recording light; a charge transport layer 63 which behaves substantially as an insulator against charges charged on the first electric conductor layer 61 (charges having a polarity of the latent image, e.g., negative charges) and as an electric conductor for charges having the reverse polarity of the latent image (charges having a transport polarity, e.g., positive charges); a reading photoconductive layer 64 which takes on photoconductivity when irradiated by the reading light; and a second electric conductor layer 65 having permeability for the reading light. The second electric conductor layer 65 comprises striped electrodes comprising a plurality of elements (wire electrodes) 65a disposed in stripes at the pitch of a pixel as shown by hatched lines in the FIG. 7.

The electric current detection means 50 includes a plurality of electric current detection amplifiers 51, each of which is connected to each element and detects an electric current in parallel produced in the respective elements by the exposure of the medium with reading light. The first electric conductor layer 61 of the electroradiographic recording medium 60 is connected to one of the input terminals of a connection means 52 and the negative electrode of a power supply 53, and the positive electrode of the power supply 53 is connected to the other input terminal of the connection means 52. Although not shown in the FIG. 7, the output of the connection means is connected to the respective electric current detection amplifiers 51. The detailed configuration of the electric current detection amplifier is not directly related to the substance of the invention and is not elaborated here, but any know configuration may be applied in various ways. Of course, the connection method of the connection means 52 and the power supply 53 may differ from that described above depending on the configuration of the electric current detection means 51 employed.

Hereinafter, the operation of the electroradiographic detection/reading system with aforementioned configuration is described.

In order to record an electrophotographic latent image on the electroradiographic recording medium 60, first, a DC voltage is impressed between the first electric conductor layer 61 and the respective elements 65a of the second electric conductor layer 65 by switching the connection means 52 onto the power supply 53 to charge both of the conductive layers, thereby an U-shaped electric field is formed between the first electric conductor layer 61 and each of the element 65a of the electroradiographic medium 65 with the element 65a being the bottom of the field.

Next, the recording light is exposed to a subject (not shown) and the recording light transmitted through the subject or the radial ray carrying electroradiographic image information of the subject is radiated onto the electroradiographic recording medium 60. By doing so, positive/negative charge pairs are developed within the recording photoconductive layer 62, and the negative charges are drawn toward the elements 65a along the distribution of the electric fields and stored on the phase boundary of the recording photoconductive layer 62 and the charge transport layer 63. The amount of the negative charges (charges of latent image) stored on the phase boundary is substantially proportional to the irradiated radiological dosage, so that the electrophotographic latent image is now carried by the charges of latent image. Thus, the electrophotographic latent image is recorded on the electroradiographic recording medium 60. Meanwhile, the positive charges developed in the recording photoconductive layer 62 are drawn to the first electric conductor layer 61 and re-coupled with negative charges injected from the power supply 53 and disappear.

In order to read out the electrophotographic image from the electroradiographic recording medium, first, the connection means 52 is switched to connect the first electric conductor layer 61 of the electroradiographic recording medium 60.

Linear reading light L radiated from the reading light exposure apparatus 100 penetrates through the glass substrate 66 and the respective elements 65a in the second electric conductor layer 65 of the electroradiographic recording medium 60. Then, positive/negative charge pairs are developed in the reading photoconductive layer 64, and the positive charges move rapidly through the charge transport layer 63 by the attraction of the negative charges (charges of the latent image) stored on the phase boundary of the recording photoconductive layer 62 and the charge transport layer 63 and are re-coupled there with and dissolved away at the boundary. Meanwhile, the negative charges developed in the reading photoconductive layer 64 are re-coupled with positive charges injected into the electric conductor layer 65 from the power supply 53 and disappear. When the negative charges stored on the electroradiographic recording medium 60 are dissolved by the charge re-coupling, electric currents are produced by the movement of the charges in the electroradiographic recording medium 60, which are detected in parallel by the electric current detection amplifiers 51 connected to the respective elements 65a. In reading out operation, the electric current flows through the electroradiographic recording medium 60 in accordance with the charges of the latent image or the electrophotographic latent image. Thus, the electrophotographic image can be read out by detecting the current. The reading light exposure apparatus 100 scans the medium in the direction indicated by the arrow in the FIG. 7, thereby the entire surface of the electroradiographic recording medium 60 is exposed.

Further, the LED chip used in the reading light exposure apparatus 100 radiates a light beam having an appropriate wavelength for reading out image information from the electroradiographic recording medium.

Although, the aforementioned embodiment used an electrophotographic medium 60 having striped electrodes as the electroradiographic recording medium, but the invention is not limited to that kind of medium. More specifically, the invention can be applied to any electroradiographic recording medium as long as it can produce electric current in accordance with electrophotographic charges which carry electroradiographic image information when scanned by the reading light.

Figure 9:
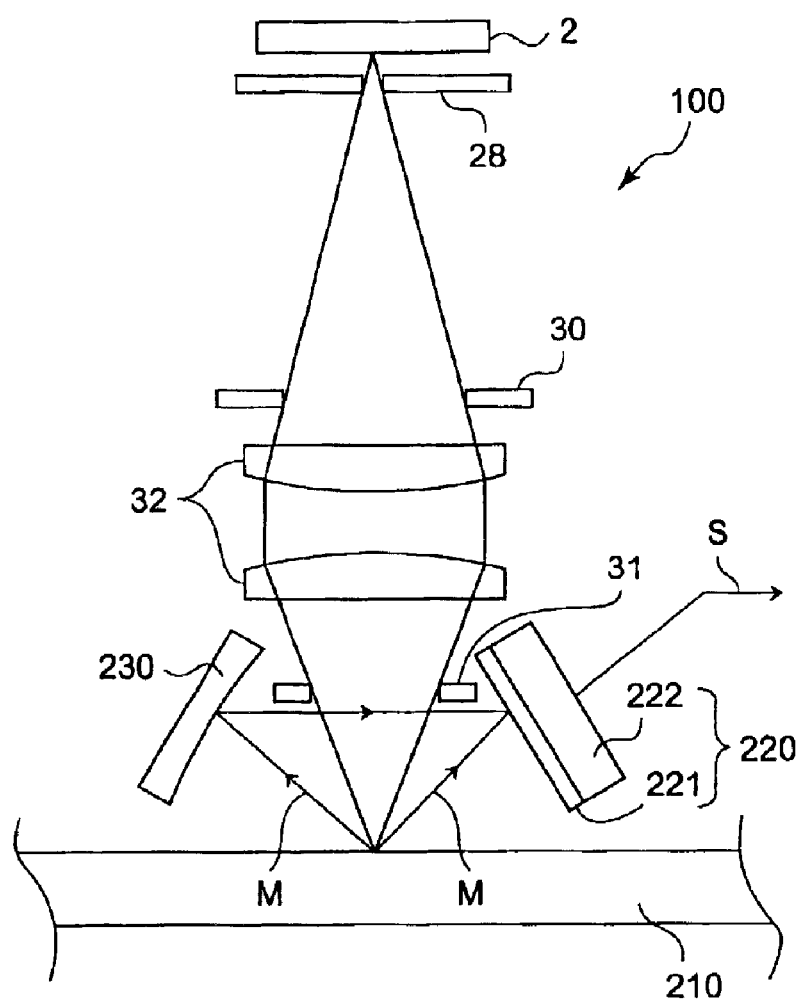
FIG. 9 is a cross-sectional view of a reading light exposure apparatus used in an image reading system for reading out images from a storage phosphor sheet, showing its detailed configuration.

FIG. 8 shows an image reading system according to a sixth embodiment of the invention, which is based on a reading light exposure apparatus of the invention and reads out images from a storage phosphor sheet. FIG. 9 is a cross-sectional view of the exposure apparatus shown in FIG. 8, showing its detailed configuration and an expanded photostimulated light detection section.

The image reading system comprises a reading light exposure apparatus 100 of the invention, which radiates reading light L onto a storage phosphor sheet 210 carrying pre-stored electroradiographic image information; a photodetector 220 extending in the direction indicated by the arrow X, which collects/detects photostimulated light M emitted from the storage phosphor sheet 210 when irradiated by the exciting light L; an exciting light cut-out filter 221 disposed on the incident plane of the photodetector 220 to prevent the exciting light M from entering into the photodetector 220; a collection mirror 230 extending in the direction indicated by the arrow X, which is disposed over the front surface of the storage phosphor sheet 210 to effectively guide the photostimulated light to the incident plane of the photodetector 220; a sheet feeding means 240, which is a belt conveyor for feeding the storage phosphor sheet 210 in the direction indicated by the arrow Y; and a signal processing section (not shown) connected to the photodetector 220. The photodetector 220 includes a plurality of photoelectric conversion elements 222 disposed in the longitudinal direction (a direction indicated by the arrow X) of the photodetector 220, each of which detects photostimulated light from the corresponding point (pixel basis) of the storage phosphor sheet. For the photoelectric conversion element, for example, an amorphous silicon sensor, a CCD sensor or a MOS sensor can be used.

Next, the operation of the image reading system according to this embodiment will be described hereinafter. The linear reading light L from the reading light exposure apparatus 100 is radiated onto the storage phosphor sheet 210, and the sheet 210 is moved (sub-scanned) by the sheet feeding means 240 in the direction indicated by the arrow Y, thereby the entire surface of the storage phosphor sheet 210 is irradiated by the reading light L.

The portion of the storage phosphor sheet exposed by the reading light emits photostimulated light M in an amount corresponding to the electroradiographic image information stored thereon. The photostimulated light emitted from the sheet spreads out and some of them enter into the incident plane of the photodetector 220 and a portion of others is reflected by the collection mirror 230 and enters into the incident plane of the photodetector 220. When the photostimulated light M enters into the incident plane of the photodetector 220, a small amount of reading light L, which is reflected from the surface of the storage phosphor sheet 210 and included in the photostimulated light M, is cut out by the cut-out filter 221. The photostimulated light M collected by the photodetector 220 is converted into an electrical signal at the respective photoelectric conversion elements, which is then amplified and sent to the external signal processing apparatus as the image signal S comprising the respective pixels from the corresponding photoelectric conversion elements 222 of the photodetector 220.

Further, the LED chip used in the reading light exposure apparatus 100 emits a light beam having an appropriate wavelength for forcing the storage phosphor sheet to emit photostimulated light.

What is claimed is:

1. A linear light source comprising a plurality of luminous elements disposed in a straight line and an optical means having an opening that defines a utilization area of the luminous elements, each of the luminous elements being a squarish surface emitting element having non-emission regions along a first diagonal line, and disposed in such a way that a second diagonal line that differs from the first diagonal line is aligned with that of adjacent elements in a straight line, and the opening of the optical means being placed opposite to the second diagonal lines aligned in a straight line.

2. A linear light source comprising a plurality of luminous elements disposed in a straight line and an optical means having an opening that defines a utilization area of the luminous elements, each of the luminous elements being a surface emitting element having a non-emission region in the approximate center and a wire is connected thereto, and disposed in such a way that the non-emission region is aligned with that of adjacent elements in a straight line, the wires being extended in the same direction substantially perpendicular to the arranging direction of the luminous elements, and the opening of the optical means being placed opposite to the emission regions located on opposite side of the wires.

3. A linear light source comprising a plurality of luminous elements disposed in a straight line and an optical means having an opening that defines a utilization area of the luminous elements, each of the luminous elements being a surface emitting element having a non-emission region in the approximate center, and disposed alternately in the direction perpendicular to the arranging direction of the elements so that a portion of each emission region is aligned with that of adjacent elements in a straight line, and the opening of the optical means being placed opposite to the emission regions aligned in a straight line.

4. A linear light source according to claim 1, wherein the luminous elements are LEDs.

5. A linear light source according to claim 2, wherein the luminous elements are LEDs.

6. A linear light source according to claim 3, wherein the luminous elements are LEDs.

7. A linear light source according to claim 1, wherein the opening of the optical means is placed in the immediate vicinity of the luminous elements.

8. A linear light source according to claim 2, wherein the opening of the optical means is placed in the immediate vicinity of the luminous elements.

9. A linear light source according to claim 3, wherein the opening of the optical means is placed in the immediate vicinity of the luminous elements.

10. A linear light source according to claim 4, wherein the opening of the optical means is placed in the immediate vicinity of the luminous elements.

11. A linear light source according to claim 5, wherein the opening of the optical means is placed in the immediate vicinity of the luminous elements.

12. A linear light source according to claim 6, wherein the opening of the optical means is placed in the immediate vicinity of the luminous elements.

13. A reading light exposure apparatus capable of radiating reading light onto an image recording medium in reading out a pre-recorded image by scanning the image recording medium with the reading light, the apparatus uses a linear light source comprising a plurality of luminous elements disposed in a straight line and an optical means having an opening that defines a utilization area of the luminous elements, each of the luminous elements being a squarish surface emitting element having non-emission regions along a first diagonal line, and disposed in such a way that a second diagonal line that differs from the first diagonal line is aligned with that of adjacent elements in a straight line, and the opening of the optical means being placed opposite to the second diagonal lines aligned in a straight line.

14. A reading light exposure apparatus according to claim 13, wherein the image recording medium is an electrophotographic recording medium which records image information as an electrophotographic latent image and produces an electric current in accordance with the latent image when scanned by the reading light.

15. A reading light exposure apparatus according to claim 13, wherein the image recording medium is a photostimulable phosphor which stores image information and emits photostimulated light in accordance with the image information when scanned by the reading light.

16. A reading light exposure apparatus capable of radiating reading light onto an image recording medium in reading out a pre-recorded image by scanning the image recording medium with the reading light, wherein the apparatus uses a linear light source comprising a plurality of luminous elements disposed in a straight line and an optical means having an opening that defines a utilization area of the luminous elements, each of the luminous elements being a surface emitting element having a non-emission region in the approximate center and a wire is connected thereto, and disposed in such a way that the non-emission region is aligned with that of adjacent elements in a straight line, the wires being extended in the same direction substantially perpendicular to the arranging direction of the luminous elements, and the opening of the optical means being placed opposite to the emission regions located on opposite side of the wires.

17. A reading light exposure apparatus according to claim 16, wherein the image recording medium is an electrophotographic recording medium which records image information as an electrophotographic latent image and produces an electric current in accordance with the latent image when scanned by the reading light.

18. A reading light exposure apparatus according to claim 16, wherein the image recording medium is a photostimulable phosphor which stores image information and emits photostimulated light in accordance with the image information when scanned by the reading light.

19. A reading light exposure apparatus capable of radiating reading light onto an image recording medium in reading out a pre-recorded image by scanning the image recording medium with the reading light, wherein the apparatus uses a linear light source comprising a plurality of luminous elements disposed in a straight line and an optical means having an opening that defines a utilization area of the luminous elements, each of the luminous elements being a surface emitting element having a non-emission region in the approximate center, and disposed alternately in the direction perpendicular to the arranging direction of the elements so that a portion of each emission region is aligned with that of adjacent elements in a straight line, and the opening of the optical means being placed opposite to the emission regions aligned in a straight line.

20. A reading light exposure apparatus according to claim 19, wherein the image recording medium is an electrophotographic recording medium which records image information as an electrophotographic latent image and produces an electric current in accordance with the latent image when scanned by the reading light.

21. A reading light exposure apparatus according to claim 19, wherein the image recording medium is a photostimulable phosphor which stores image information and emits photostimulated light in accordance with the image information when scanned by the reading light.

\* \* \* \* \*